(12) United States Patent  
Shih et al.

(10) Patent No.: US 8,624,131 B2
(45) Date of Patent: Jan. 7, 2014

(54) CHIP-ON-FILM PANEL STRUCTURE

(75) Inventors: Ming-hung Shih, Shenzhen (CN); Meng Li, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 203 days.

(21) Appl. No.: 13/378,042

(22) PCT Filed: Oct. 21, 2011

(86) PCT No.: PCT/CN2011/081086
§ 371 (c)(1),
(2), (4) Date: Dec. 13, 2011

(87) PCT Pub. No.: WO2013/056456
PCT Pub. Date: Apr. 25, 2013

(65) Prior Publication Data
US 2013/0092418 A1    Apr. 18, 2013

(51) Int. Cl.
*H05K 1/11* (2006.01)
(52) U.S. Cl.
USPC .......................................................... 174/261

(58) Field of Classification Search
USPC .......................................................... 174/261
See application file for complete search history.

(56) References Cited

U.S. PATENT DOCUMENTS

| | | | |
|---|---|---|---|
| 5,951,304 A * | 9/1999 | Wildes et al. | 439/67 |
| 8,476,531 B2 * | 7/2013 | Takahashi et al. | 174/254 |
| 2007/0119614 A1 * | 5/2007 | Shimoishizaka et al. | 174/250 |
| 2011/0278047 A1 * | 11/2011 | Yamauchi et al. | 174/254 |
| 2013/0087366 A1 * | 4/2013 | Michael et al. | 174/252 |

* cited by examiner

*Primary Examiner* — Jeremy Norris

(57) ABSTRACT

The present invention relates to a chip-on-film panel structure, which has a panel body and fan-out leads, first metal sheets, array leads and second metal leads thereon. The array leads are disposed at two sides of the fan-out leads, the second metal sheets are disposed at two sides of the first metal sheets, and the length of each of the second metal sheet is less than the length of each of the first metal sheet to form a lead-out area that the array leads are led out from the second metal sheets via the lead-out area. The chip-on-film panel structure having an arranged fan-out area for array leads can settle the problem of being difficult to narrow the frame of the panel because the array leads occupy available room for fan-out leads and force the fan-out area to expand longitudinally.

17 Claims, 2 Drawing Sheets

CHIP-ON-FILM PANEL STRUCTURE

FIELD OF THE INVENTION

The present invention relates to a design field of panel structure, especially to a chip-on-film panel structure having a lead-out area for array leads.

BACKGROUND OF THE INVENTION

At present, OLB (Out Leader Bonding) technique that is used frequently in liquid crystal display device industry has two types: COF (Chip on Film) and COG (Chip on Glass). Usually, if the OLB technique is applied in COF type, when arranging fan-out leads 110 at the initial stage of panel structure design, the panel using COF type usually needs to have more space (an experience value may be 2 mm) to be reserved at two opposite sides for arranging array leads 130 by a WOA (Wire on Array) lead-arrangement technique (as shown in FIG. 1). The arrangement of the array leads 130 shown in FIG. 1 on one hand occupies available space of the fan-out leads 110, and on the other hand it makes the area of the fan-out leads 110 expand in length such that it is difficult to accomplish narrowing the frame of the panel.

Hence, it is necessary to provide a chip-on-film panel structure to overcome the problems existing in the conventional technology.

SUMMARY OF THE INVENTION

An object of the invention is to provide a chip-on-film panel structure having a lead-out area for array leads to settle the technical problem of a conventional chip-on-film panel structure of being difficult to narrow the frame of the panel because the array leads occupy available room for fan-out leads and force the fan-out area to expand longitudinally.

In order to settle the aforementioned problems, a technical solution provided by the present invention is as follows:

The present invention relates to a chip-on-film panel structure, which comprises a panel body, a plurality of fan-out leads mounted on the panel body, a plurality of first metal sheets mounted on the panel body and used to be connected to the fan-out leads, a plurality of array leads mounted on the panel body and a plurality of second metal sheets mounted on the panel body and used to be connected to the array leads, wherein the array leads are disposed at two sides of the fan-out leads, the second metal sheets are disposed at two sides of the first metal sheets, the length of each of the second metal sheets is less than the length of each of the first metal sheets to form a lead-out area, and the array leads are led out from the second metal sheets via the lead-out area; the first metal sheets and the second metal sheets are mounted parallel to each other, and each of the metal sheets has a first end and a second end, wherein the first ends of the first metal sheets are connected to the fan-out leads, the first ends of the second metal sheets are aligned with the first ends of the first metal sheets, and the lead-out area is positioned beside the second ends of the second metal sheets; the array leads are led out from the second ends of the second metal sheets; the length of each of the second metal sheets is ⅓ up to ⅔ of the length of each of the first metal sheets; the width of each of the second metal sheets is greater than the width of each of the first metal sheets; and the area of each of the second metal sheets is determined by the area of each of the first metal sheets.

The present invention relates to a chip-on-film panel structure, which comprises a panel body, a plurality of fan-out leads mounted on the panel body, a plurality of first metal sheets mounted on the panel body and used to be connected to the fan-out leads, a plurality of array leads mounted on the panel body and a plurality of second metal sheets mounted on the panel body and used to be connected to the array leads, wherein the array leads are disposed at two sides of the fan-out leads, the second metal sheets are disposed at two sides of the first metal sheets, the length of each of the second metal sheets is less than the length of each of the first metal sheets to form a lead-out area, and the array leads are led out from the second metal sheets via the lead-out area.

In the chip-on-film panel structure of the present invention, the first metal sheets and the second metal sheets are mounted parallel to each other, and each of the metal sheets has a first end and a second end, wherein the first ends of the first metal sheets are connected to the fan-out leads, the first ends of the second metal sheets are aligned with the first ends of the first metal sheets, and the lead-out area is at a position beside the second ends of the second metal sheets; the array leads are led out from the second ends of the second metal sheets.

In the chip-on-film panel structure of the present invention, the first metal sheets and the second metal sheets are mounted parallel to each other, and each of the metal sheets has a first end and a second end, wherein the first ends of the first metal sheets are connected to the fan-out leads, the second ends of the second metal sheets are aligned with the second ends of the first metal sheets, and the lead-out area is at a position beside the first ends of the second metal sheets; the array leads are led out from the first ends of the second metal sheets.

In the chip-on-film panel structure of the present invention, the first metal sheets and the second metal sheets are mounted parallel to each other, and each of the metal sheets has a first end and a second end, wherein the first ends of the first metal sheets are connected to the fan-out leads, the lead-out area is at positions respectively beside the first ends and the second ends of the second metal sheets; the array leads are led out from the first ends and the second ends of the second metal sheets.

In the chip-on-film panel structure of the present invention, the length of each of the second metal sheets is ⅓ up to ⅔ of the length of each of the first metal sheets.

In the chip-on-film panel structure of the present invention, the length of each of the second metal sheets is ranged from 0.4 to 0.6 mm.

In the chip-on-film panel structure of the present invention, the width of each of the second metal sheets is greater than the width of each of the first metal sheets.

In the chip-on-film panel structure of the present invention, the area of each of the second metal sheets is determined by the area of each of the first metal sheets.

The chip-on-film panel structure of the present invention has following advantages: arranging a lead-out area for array leads can settle the technical problem of a conventional chip-on-film panel structure that the frame of the panel is difficult to be narrowed because the array leads occupy the available room for fan-out leads and make the fan-out area to expand longitudinally.

This invention is detailed described with reference to the following preferred embodiments and the accompanying drawings, where the aforementioned contents of this invention can be made more clear and understandable.

DETAILED DESCRIPTION OF THE PREFERRED EMBODIMENTS

The following embodiments are described with reference to the following accompanying drawings which exemplify the realization of the present invention. In the following drawings, objects in similar structure are marked by same numerals.

Figure 1:
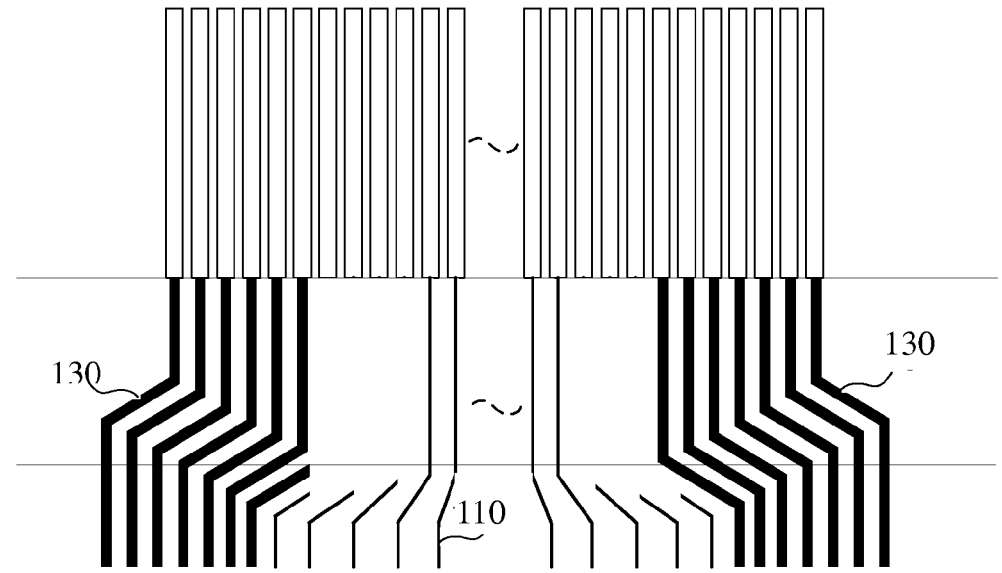
FIG. 1 is a structural scheme view of a conventional chip-on-film panel structure.
Figure 2:
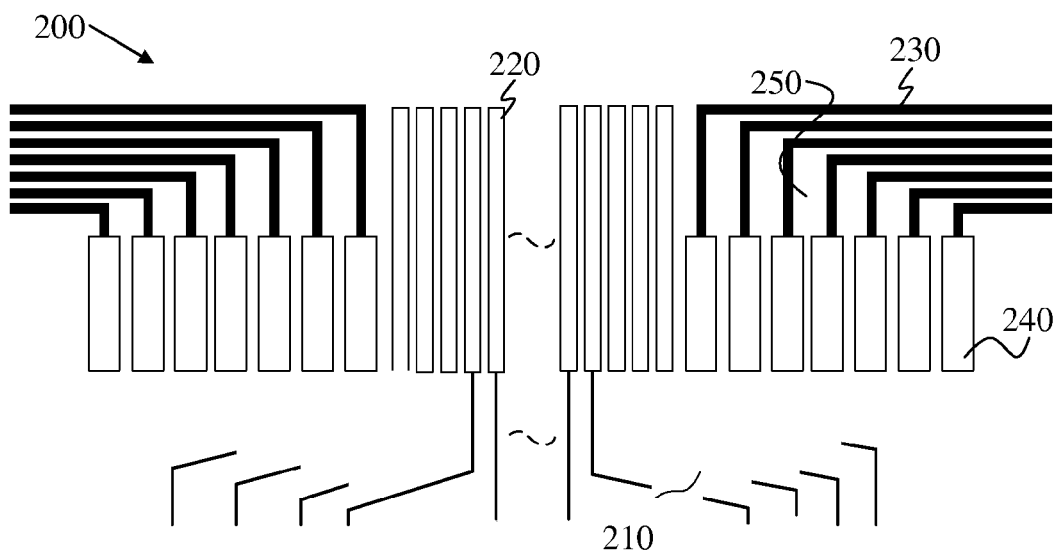
FIG. 2 is a structural scheme view of a first preferred embodiment of a chip-on-film panel structure in accordance with the present invention.

FIG. 2 is a structural scheme view of a first preferred embodiment of a chip-on-film panel structure in accordance with the present invention, and the chip-on-film panel structure comprises a panel body 200 a plurality of fan-out leads 210 mounted on the panel body 200, a plurality of first metal sheets 220 mounted on the panel body 200 and used to be connected to the fan-out leads 210, a plurality of array leads 230 mounted on the panel body 200 and a plurality of second metal sheets 240 mounted on the panel body 200 and used to be connected to the array leads 230. The array leads 230 are positioned at two sides of the fan-out leads 210, and the second metal sheets 240 are disposed at two sides of the first metal sheets 220, wherein the length of each of the second metal sheets 240 is less than the length of each of the first metal sheets 220 to form a lead-out area 250 such that the array leads 230 are led out from the second metal sheets 240 via the lead-out area 250.

In FIG. 2, the first metal sheets 220 and the second metal sheets 240 are mounted parallel to each other. Each of the metal sheets has a first end and a second end. The first ends of the first metal sheets 220 are connected to the fan-out leads 210. The first ends of the second metal sheets 240 are aligned with the first ends of the first metal sheets 220. The lead-out area 250 is disposed at a position beside the second ends of the second metal sheets 240, and the array leads 230 are led out from the second ends of the second metal sheets 240.

Because the fan-out leads 210 are to be led out from the first ends of the first metal sheets 220, if the array leads 230 are led out from the first ends of the second metal sheets 240, some available room for the fan-out leads 210 will be occupied and the length of the area of the fan-out leads 210 will be increased. The chip-on-film panel structure having the lead-out area 250 can enormously reduce the affection to the available room for the fan-out leads 210 that the leading-out of the array leads 230 may cause. Meanwhile, in this embodiment, the array leads 230 are led out from the second ends of the second metal sheets 240, the led-out direction thereof is opposite to the led-out direction of the fan-out leads 210, which sufficiently uses spare room of the panel body 200 to reduce the affection of the array leads 230 causing on the available room for the fan-out leads 210 by the greatest extent.

In the first preferred embodiment of the chip-on-film panel structure of the present invention, the length of each of the second metal sheets 240 is ⅓ up to ⅔ of the length of each of the first metal sheets 220, and the length of the second metal sheet 240 is ranged from 0.4 to 0.6 mm.

The decrement of the lengths of the second metal sheets 240 determines the size of the lead-out area 250. If the lengths of the second metal sheets 240 are excessive, the size of the lead-out area 250 will be too small and not sufficient for all the array leads 230 to be led out. If the lengths of the second metal sheets 240 are inadequate, the panel body 200 may have too much room that affects the appearance of the panel (each of the metal sheets requires sufficient pressing area and electric conductive particles while executing the chip-on-film bonding process; as the length of the metal sheet is reduced, the width of the metal sheet must be increased correspondingly to ensure the size of the area of the metal sheet (pressing area)). The length of each of the second metal sheets 240 being ⅓ up to ⅔ of the length of each of the first metal sheets 220 (approximately 0.4 to 0.6 mm) ensures the size of the lead-out area 250 and the appearance of the panel body 200.

Figure 3:
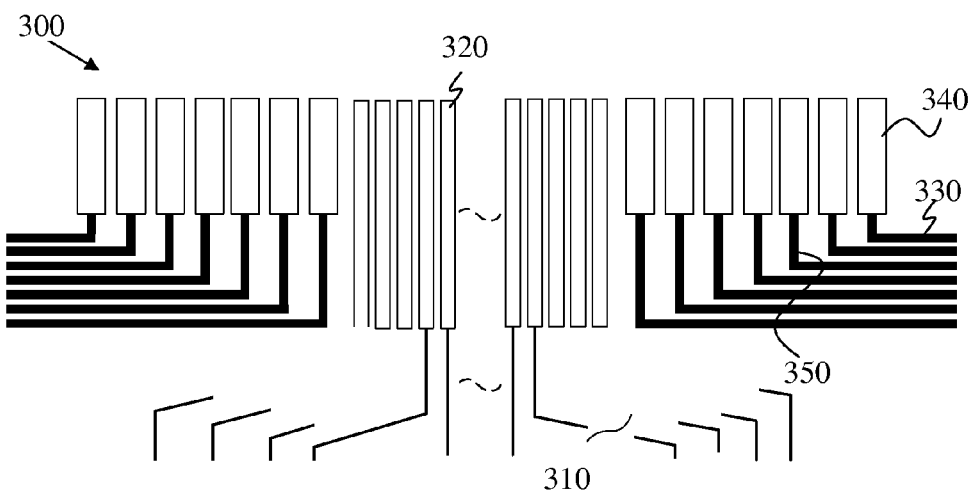
FIG. 3 is a structural scheme view of a second preferred embodiment of a chip-on-film panel structure in accordance with the present invention.

FIG. 3 is a structural scheme view of a second preferred embodiment of a chip-on-film panel structure in accordance with the present invention. In FIG. 3, the first metal sheets 320 and the second metal sheets 340 are mounted parallel to each other. Each of the metal sheets has a first end and a second end. The first ends of the first metal sheets 320 are connected to the fan-out leads 310. The second ends of the second metal sheets 340 are aligned with the second ends of the first metal sheets 320. The lead-out area 350 is disposed at a position beside the first ends of the second metal sheets 340, and the array leads 330 are led out from the first ends of the second metal sheets 340.

In this embodiment, as aligning the second ends of the second metal sheets 340 with the second ends of the first metal sheets 320 and arranging the lead-out area 350 at the position beside the first ends of the second metal sheets 340, though the array leads 330 are still led out from the first ends of the second metal sheets 340, the design of the lead-out area 350 enormously reduces the affection that leading out the array leads 330 may cause on the available room for the fan-out leads 310.

As the second preferred embodiment of the chip-on-film panel structure of the present invention, the length of each of the second metal sheets 340 is ⅓ up to ⅔ of the length of each of the first metal sheets 320, and the length of the second metal sheet 340 is ranged from 0.4 to 0.6 mm.

The decrement of the lengths of the second metal sheets 340 determines the size of the lead-out area 350. If the lengths of the second metal sheets 340 are excessive, the size of the lead-out area 350 will be too small and not sufficient for all the array leads 330 to be led out. If the lengths of the second metal sheets 340 are inadequate, the panel body 300 may have too much room that affects the appearance of the panel (each of the metal sheets requires sufficient pressing area and electric conductive particles while executing the chip-on-film bonding process; as the length of the metal sheet is reduced, the width of the metal sheet must be increased correspondingly to ensure the size of the area of the metal sheet (pressing area)). The length of each of the second metal sheets 340 being ⅓ up to ⅔ of the length of each of the first metal sheets 320 (approximately 0.4 to 0.6 mm) ensures the size of the lead-out area 350 and the appearance of the panel body 300.

Figure 4:
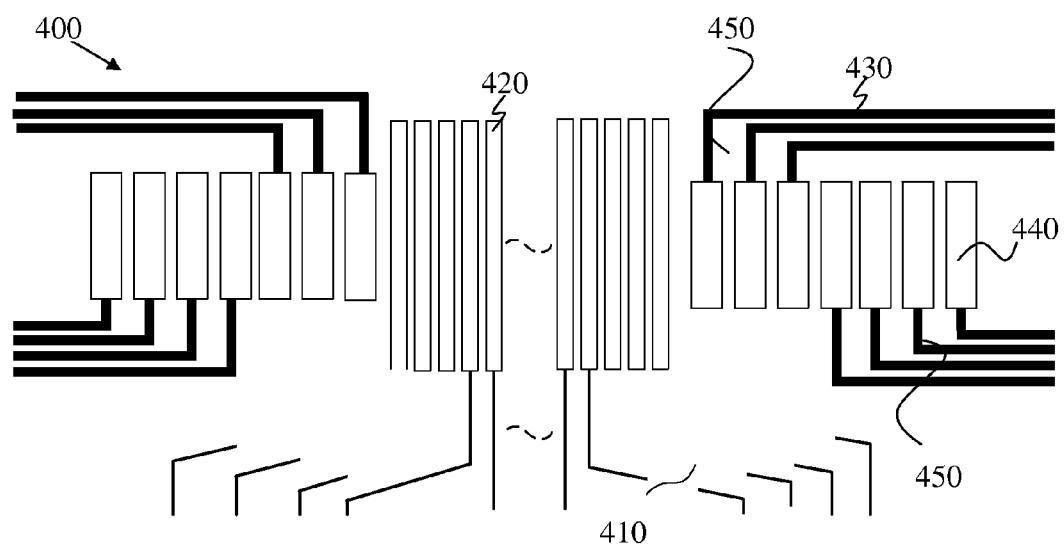
FIG. 4 is a structural scheme view of a third preferred embodiment of a chip-on-film panel structure in accordance with the present invention.

FIG. 4 is a structural scheme view of a third preferred embodiment of a chip-on-film panel structure in accordance with the present invention. In FIG. 4, the first metal sheets 420 and the second metal sheets 440 are mounted parallel to each other. Each of the metal sheets has a first end and a second end. The first ends of the first metal sheets 420 are connected to the fan-out leads 410. The lead-out area 450 is disposed at both positions beside the first ends and the second ends of the second metal sheets 440, and the array leads 430 are led out both from the first ends and the second ends of the second metal sheets 440.

In this embodiment, as the lead-out area 450 is disposed at positions beside the first ends and the second ends of the second metal sheets 440, the array leads 430 can be selectively led out from the first ends or the second ends of the second metal sheets 440 according to specific requirements. No matter which ends of the second metal sheets 440 the array leads 430 are led from, the design of the lead-out area 450 will reduce the affection that leading out the array leads 430 may cause on the available room for the fan-out leads 410.

As the second preferred embodiment of the chip-on-film panel structure of the present invention, the length of each of the second metal sheets 440 is ⅓ up to ⅔ of the length of each of the first metal sheets 420, and the length of the second metal sheet 440 is ranged from 0.4 to 0.6 mm.

The decrement of the lengths of the second metal sheets 440 determines the size of the lead-out area 450. If the lengths of the second metal sheets 440 are excessive, the size of the lead-out area 450 will be too small and not sufficient for all the array leads 430 to be led out. If the lengths of the second metal sheets 440 are inadequate, the panel body 400 may have too much room left that affects the appearance of the panel (each of the metal sheets requires sufficient pressing area and electric conductive particles while executing the chip-on-film bonding process; as the length of the metal sheet is decreased, the width of the metal sheet must be increased correspondingly to ensure the size of the area of the metal sheet (pressing area)). The length of each of the second metal sheets 440 being ⅓ up to ⅔ of the length of each of the first metal sheets 420 (approximately 0.4 to 0.6 mm) ensures the size of the lead-out area 450 and the appearance of the panel body 400.

As the preferred embodiment of the chip-on-film panel structure of the present invention, the width of each of the second metal sheets is greater than the width of each of the first metal sheets, and the area of each of the second metal sheets is determined by the area of each of the first metal sheets.

The chip-on-film panel structure of the present invention increases the width of each of the second metal sheets while forming the lead-out area by reducing the lengths of the second metal sheets, and thereby ensures that each second metal sheet has sufficient area and electric conductive particles for bonding operation. When the area of each of the second metal sheets is substantially equal to the area of each of the first metal sheets, it will achieve the same bonding effect as conventional second metal sheets may achieve in the prior art.

By means of the arrangement of the lead-out area, the chip-on-film panel structure of the present invention does not need to reserve in advance or reduce the room for arranging the array leads, such that the length of the fan-out area can be shortened and the frame of the panel can be further narrowed.

In conclusion, although a few embodiments of the present invention have been disclosed, the above preferred embodiments are not used for limiting this invention, and it will be understood by those of ordinary skill in the art that various changes in form and details may be made therein without departing from the spirit and scope of the present invention. The invention is intended to be limited only by the appended claims.

What is claimed is:

1. A chip-on-film panel structure comprising a panel body, a plurality of fan-out leads mounted on the panel body, a plurality of first metal sheets mounted on the panel body and used to be connected to the fan-out leads, a plurality of array leads mounted on the panel body and a plurality of second metal sheets mounted on the panel body and used to be connected to the array leads, characterized in that:

the array leads are disposed at two sides of the fan-out leads, the second metal sheets are disposed at two sides of the first metal sheets, the length of each of the second metal sheets is less than the length of each of the first metal sheets to form a lead-out area, and the array leads are led out from the second metal sheets via the lead-out area;

the first metal sheets and the second metal sheets are mounted parallel to each other, and each of the metal sheets has a first end and a second end, wherein the first ends of the first metal sheets are connected to the fan-out leads, the first ends of the second metal sheets are aligned with the first ends of the first metal sheets, and the lead-out area is positioned beside the second ends of the second metal sheets; the array leads are led out from the second ends of the second metal sheets;

the length of each of the second metal sheets is ⅓ up to ⅔ of the length of each of the first metal sheets;

the width of each of the second metal sheets is greater than the width of each of the first metal sheets; and the area of each of the second metal sheets is determined by the area of each of the first metal sheets.

2. A chip-on-film panel structure comprising a panel body, a plurality of fan-out leads mounted on the panel body, a plurality of first metal sheets mounted on the panel body and used to be connected to the fan-out leads, a plurality of array leads mounted on the panel body and a plurality of second metal sheets mounted on the panel body and used to be connected to the array leads, characterized in that:

the first metal sheets and the second metal sheets are mounted parallel to each other, and each of the metal sheets has a first end and a second end, wherein the first ends of the first metal sheets are connected to the fan-out leads, the first ends of the second metal sheets are aligned with the first ends of the first metal sheets, and the lead-out area is positioned beside the second ends of the second metal sheets; the array leads are led out from the second ends of the second metal sheets.

3. The chip-on-film panel structure as claimed in claim 2, characterized in that: the first metal sheets and the second metal sheets are mounted parallel to each other, and each of the metal sheets has a first end and a second end, wherein the first ends of the first metal sheets are connected to the fan-out leads, the first ends of the second metal sheets are aligned with the first ends of the first metal sheets, and the lead-out area is at a position beside the second ends of the second metal sheets; the array leads are led out from the second ends of the second metal sheets.

4. The chip-on-film panel structure as claimed in claim 3, characterized in that: the length of each of the second metal sheets is ⅓ up to ⅔ of the length of each of the first metal sheets.

5. The chip-on-film panel structure as claimed in claim 4, characterized in that: the length of each of the second metal sheets is ranged from 0.4 to 0.6 mm.

6. The chip-on-film panel structure as claimed in claim 3, characterized in that: the width of each of the second metal sheets is greater than the width of each of the first metal sheets.

7. The chip-on-film panel structure as claimed in claim 6, characterized in that: the area of each of the second metal sheets is determined by the area of each of the first metal sheets.

8. The chip-on-film panel structure as claimed in claim 2, characterized in that: the first metal sheets and the second metal sheets are mounted parallel to each other, and each of the metal sheets has a first end and a second end, wherein the first ends of the first metal sheets are connected to the fan-out leads, the second ends of the second metal sheets are aligned with the second ends of the first metal sheets, and the lead-out area is at a position beside the first ends of the second metal sheets; the array leads are led out from the first ends of the second metal sheets.

9. The chip-on-film panel structure as claimed in claim 8, characterized in that: the length of each of the second metal sheets is ⅓ up to ⅔ of the length of each of the first metal sheets.

10. The chip-on-film panel structure as claimed in claim 9, characterized in that: the length of each of the second metal sheets is ranged from 0.4 to 0.6 mm.

11. The chip-on-film panel structure as claimed in claim 8, characterized in that: the width of each of the second metal sheets is greater than the width of each of the first metal sheets.

12. The chip-on-film panel structure as claimed in claim 11, characterized in that: the area of each of the second metal sheets is determined by the area of each of the first metal sheets.

13. The chip-on-film panel structure as claimed in claim 2, characterized in that: the first metal sheets and the second metal sheets are mounted parallel to each other, and each of the metal sheets has a first end and a second end, wherein the first ends of the first metal sheets are connected to the fan-out leads, the lead-out area is at positions respectively beside the first ends and the second ends of the second metal sheets; the array leads are led out from the first ends and the second ends of the second metal sheets.

14. The chip-on-film panel structure as claimed in claim 13, characterized in that: the length of each of the second metal sheets is ⅓ up to ⅔ of the length of each of the first metal sheets.

15. The chip-on-film panel structure as claimed in claim 14, characterized in that: the length of each of the second metal sheets is ranged from 0.4 to 0.6 mm.

16. The chip-on-film panel structure as claimed in claim 13, characterized in that: the width of each of the second metal sheets is greater than the width of each of the first metal sheets.

17. The chip-on-film panel structure as claimed in claim 16, characterized in that: the area of each of the second metal sheets is determined by the area of each of the first metal sheets.

* * * * *